United States Patent [19]

Estes et al.

[11] Patent Number: 5,613,858
[45] Date of Patent: Mar. 25, 1997

[54] COMPACT CIRCUIT BOARD SWITCHING APPARATUS AND ASSOCIATED METHODS

[75] Inventors: Scott H. Estes; N. Deepak Swamy, both of Austin, Tex.

[73] Assignee: Dell U.S.A., L.P., Austin, Tex.

[21] Appl. No.: 683,179

[22] Filed: Jul. 18, 1996

Related U.S. Application Data

[63] Continuation of Ser. No. 355,737, Dec. 14, 1994, abandoned.

[51] Int. Cl.$^6$ ................................................ H01R 29/00
[52] U.S. Cl. ............................................ 439/46; 29/852
[58] Field of Search ......................... 439/46, 47; 29/852

[56] References Cited

U.S. PATENT DOCUMENTS

| | | | |
|---|---|---|---|
| 3,434,095 | 3/1969 | DeRose | 439/47 |
| 3,904,263 | 9/1975 | Norman | 439/46 |
| 5,015,207 | 5/1991 | Koepke | 439/47 |
| 5,102,352 | 4/1992 | Arisaka | 439/47 |
| 5,133,669 | 7/1992 | Barnhouse et al. | 439/47 |

*Primary Examiner*—Neil Abrams
*Assistant Examiner*—Eugene Byrd
*Attorney, Agent, or Firm*—Haynes and Boone, L.L.P.

[57] ABSTRACT

A circuit board structure is provided with a compact switching system for selectively connecting and disconnecting a pair of electrically conductive lead portions thereof. The switching system includes a through hole formed in the substrate portion and extending between its opposite sides. The interior side surface of the through hole is plated with an electrically conductive metal material. Portions of the plating are then removed to leave a mutually spaced plurality of plating segments within the through hole. Each plating segment is connected to an end of one of the circuit board leads. A switch structure is provided and has a contact portion which is insertable into the through hole and movable therein, into and out of engagement with a pair of the spaced plating segments, to selectively and electrically couple the circuit board leads associated with the plating segment pair.

21 Claims, 5 Drawing Sheets

COMPACT CIRCUIT BOARD SWITCHING APPARATUS AND ASSOCIATED METHODS

This is a continuation of application Ser. No. 08/355,737 filed on Dec. 14, 1994, now abandoned.

BACKGROUND OF THE INVENTION

The present invention generally relates to circuit board apparatus and, in a preferred embodiment thereof, more particularly relates to switching apparatus and associated methods for selectively coupling electrically conductive lead portions of a circuit board.

Electronic devices, such as printed circuit boards, often require a mechanical switch structure to selectively couple and uncouple electrically conductive portions thereof such as a pair of electrically conductive traces on a circuit board. However, in many instances circuit boards lack the requisite surface area or surrounding installation volume to conveniently accommodate conventional mechanical switch structures, such as pin headers and jumper blocks, due to the physical size of these types of switch structures.

A need thus exists in the realm of circuit boards for more compact mechanical switching apparatus. It is accordingly an object of the present invention to provide a circuit board having incorporated therein switching apparatus and associated methods which reduce the switch space requirements in the circuit board.

SUMMARY OF THE INVENTION

In carrying out principles of the present invention, in accordance with a preferred embodiment thereof, a circuit board is provided that comprises a dielectric substrate member having first and second opposite sides, and a through hole extending through the substrate member between its first and second sides. In forming the circuit board the entire interior side surface of the through hole is plated with an electrically conductive material. Spaced apart portions of the plating are then appropriately removed to leave on the interior through hole side surface a mutually spaced apart plurality of plating segments each electrically coupled to an end of one of a mutually spaced apart plurality of electrically conductive leads carried by the substrate member.

The segmentally plated through hole forms a portion of a compact switching system that embodies principles of the present invention and is useable to selectively and electrically coupling and decoupling at least one predetermined set of leads in the mutually spaced apart plurality thereof. The switching system also includes a switch structure having an electrically conductive portion removably insertable into the through hole and being movable therein, into and out of engagement with a predetermined set of plating segments in the mutually spaced apart plurality thereof, to electrically couple and decouple the predetermined plating segment set and thus electrically couple and decouple their associated electrical leads.

In a first embodiment of the invention, the electrically conductive portion of the switch structure is rotatable within the through hole, by rotating the entire switch structure, between a first position in which a resilient contact section of the electrically conductive portion engages the plating segment set, and a second position in which the resilient contact section of the electrically conductive portion is disengaged from the plating segment set.

In a second embodiment of the invention, the switch structure is a push-to-activate switch having a manually depressible push button which, when depressed, causes the electrically conductive portion of the switch structure to rotate through a predetermined arc within the through hole.

In a third embodiment of the invention, the switch structure is a shunt, and the electrically conductive portion thereof is axially movable through the through hole to effect the selective coupling and decoupling of the predetermined plating segment set. According to a feature of the invention the electrically conductive portion of this switch structure embodiment is of a bimetallic structure and is thermally deflectable out of engagement with the plating segment set in being heated by a predetermined maximum current flow therethrough.

In a fourth embodiment of the invention, the switch structure is also a shunt, and the plating segments are arranged in a plurality of axially spaced apart sets that may be selectively coupled and decoupled. The shunt is axially movable through the through hole to bring its electrically conductive portion into and out of engagement with the axially spaced apart plating segment sets.

According to another aspect of the present invention, cooperating alignment means are formed on the substrate member and its associated switch structure for providing visual indicia with respect to which of its various coupling and decoupling positions the particular inserted switch structure is in.

DETAILED DESCRIPTION

Figure 1:
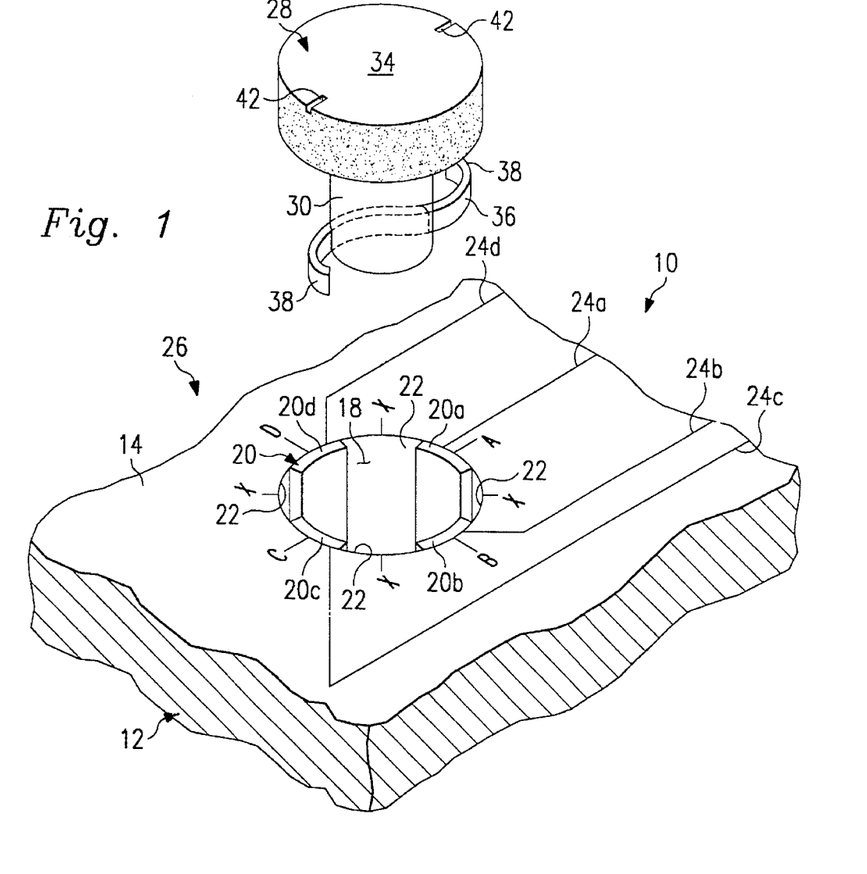
FIG. 1 is a simplified exploded top side perspective view of a portion of a circuit board having incorporated therein switching apparatus embodying principles of the present invention.

Perspectively illustrated in FIG. 1 is a portion of a circuit board structure 10 embodying principles of the present invention and including a dielectric substrate member 12 having top and bottom sides 14 and 16. Extending through the substrate member 12, between its top and bottom sides 14 and 16, is a circularly cross-sectioned through hole 18. The interior side surface of the through hole 18 is initially plated in a conventional manner with an electrically conductive material 20.

Figure 2:
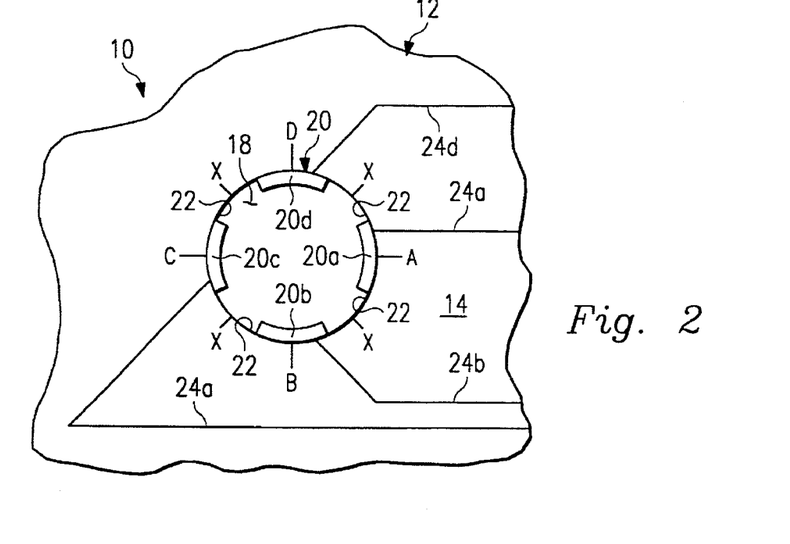
FIG. 2 is a top plan view of the circuit board portion with the switch structure removed therefrom.

Circumferentially spaced axial segments of the plating material 20, extending between its upper and lower ends, are then appropriately removed to leave the circumferentially spaced plating material segments 20a–20d adhered to the inner side surface of the through hole 18 as illustrated in FIGS. 1 and 2. The plating segments in each adjacent pair thereof are circumferentially separated from one another by a nonconductive interior side surface portion 22 of the through hole 18. Electrically conductive lead means, representatively in the form of surface traces 24a–24d extending along the top side 14 of the substrate portion 12, are respectively coupled at inner ends thereof to the plating segments 20a–20d.

The segmentally plated through hole 18 forms a portion of a specially designed compact switching system 26 embodying principles of the present invention and incorporated into the circuit board structure 10. Switching system 26 also comprises a compact switch structure 28 (see FIG. 1) including a cylindrical plastic body portion 28 having a diameter less than that of the segmentally plated through hole 18, and a radially enlarged cylindrical upper end section 32 having a top side 34 and a diameter somewhat greater than that of the segmentally plated through hole 18. An elongated metal switch contact arm member 36 has a central longitudinal portion thereof extending diametrically through and anchored within a lower end of the switch structure body portion 30. As indicated, the outer ends 38 of the contact arm member are bent in a generally counterclockwise direction as viewed from the top end of the switch structure 28.

Figure 3:
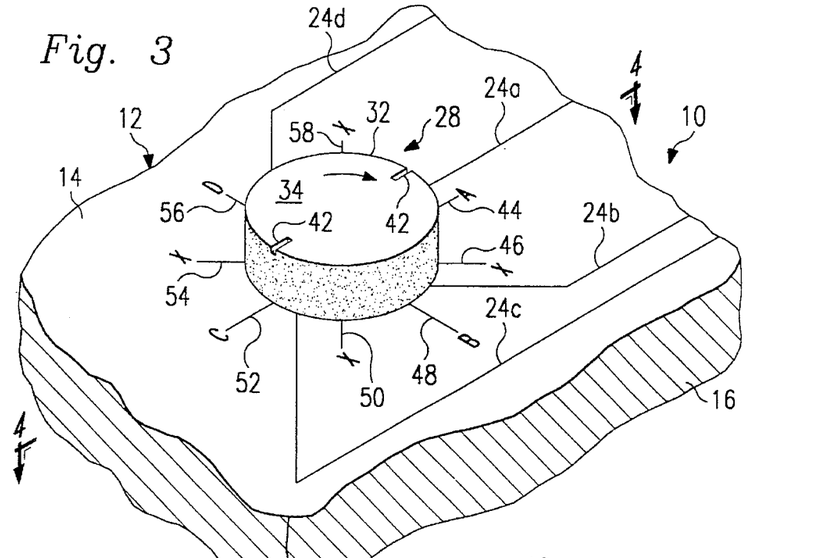
FIG. 3 is an enlarged scale top side perspective view of the circuit board portion with the switch structure operatively installed therein.
Figure 4A:
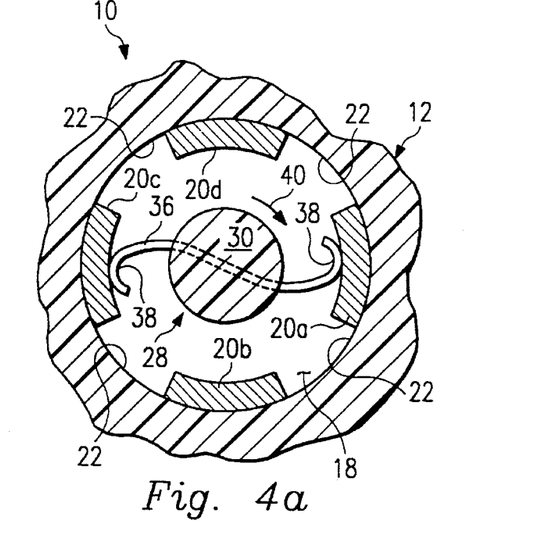
FIGS. 4A and 4B are simplified cross-sectional views through the circuit board portion and installed switch structure taken along line 4—4 of FIG. 3 and illustrating the operation of the switch structure.

Referring now to FIGS. 3–4A, to quickly assemble the compact switching system 26, the switch structure body portion 30 is simply inserted downwardly into the segmentally plated through hole 18 until the underside of the top switch structure end section 32 engages the top side 14 of the substrate portion 12. The top end section 32 of the switch structure body portion 30 may then be rotated in a clockwise direction, as indicated by the arrow 40 in FIG. 4A, to selectively (1) couple the leads 24a and 24c, (2) couple the leads 24b and 24d, or (3) electrically isolate the leads 24a–24d from one another.

Figure 4B:
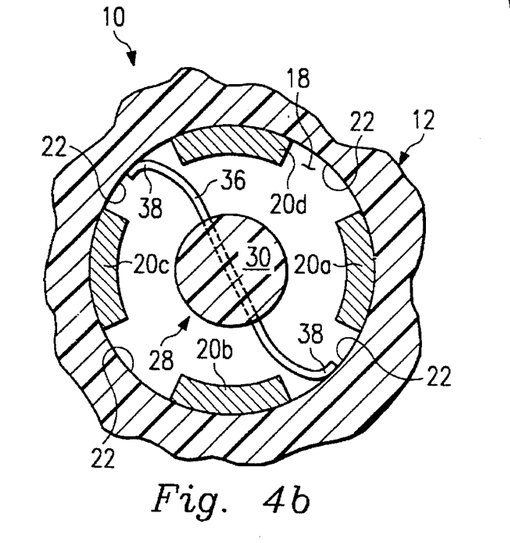

For example, the switch structure 28 may be rotated relative to the substrate portion 12 to bring the outer contact arm end portions 38 into resilient engagement with the plating segments 20a and 20c, as indicated in FIG. 4A, to thereby electrically couple their associated leads 20a and 20c. The switch structure 28 may then be further rotated in a clockwise direction, as indicated in FIG. 4B, to move the contact arm end portions 38 circumferentially past the plating segments 20a and 20c, and into engagement with a diametrically opposed pair of nonconductive surface portions 22 of the through hole 18, to thereby decouple the leads 20a and 20c. A further clockwise rotation of the switch structure brings the contact arm end portions 38 into resilient engagement with the plating segments 20b and 20d, thereby coupling the leads 24b and 24d, and a still further clockwise rotation of the switch structure 28 moves the contact arm end portions circumferentially past the plating segments 20b and 20d to thereby decouple their associated leads 24b and 24d.

To provide a visual indication with respect to which of the lead pairs 20a,20c and 20b,20d are coupled, or the coupling of neither lead pair, cooperating alignment indicia are formed on the top side 14 of the substrate portion 12 and the top side 34 of the upper end section 32 of the switch structure body portion 30. As best illustrated in FIGS. 2 and 3, these alignment indicia include a diametrically opposite pair of radially extending lines 42 disposed on the top side 34 of the upper end section 32 of the switch structure body portion 30, and a circumferentially spaced series of lines 44, 46, 48, 50, 52, 54, 56 and 58 formed on the top side 14 of the substrate portion 12 and extending radially outwardly from the through hole 18.

Lines 44, 48, 52 and 56 are respectively and circumferentially aligned with the plating segments 20a, 20b, 20c and 20d, and the lines 46, 50, 54 and 58 are circumferentially aligned with the nonconductive interior side surface portions 22 of the through hole 18. Adjacent the outer ends of the lines 44, 48, 52 and 54 the letters "A", "B", "C" and "D" are respectively imprinted on the top side 14 of the substrate portion 12, and adjacent the outer ends of the lines 46, 50, 54 and 58 the letter "X" is imprinted on the top side 14 of the substrate portion 12.

As can be seen by comparing FIGS. 2–4B, an alignment of the switch structure lines 42 with a diametrically opposite pair of the indicia lines on the top side 14 of the substrate portion 12 provides a visual indication of the position of the switch contact arm end portions 38 with respect to the plating segments 22a–22d within the through hole 18. For example, as indicated in FIG. 3, when the switch structure lines 42 are aligned with the substrate lines 44 and 52 the contact arm 36 is electrically coupling the segments 20a and 20c, thereby electrically coupling their associated leads 24a and 24c. When the switch structure lines 42 are aligned with either diametrically opposed pair of substrate lines 46,54 or 50,58 the contact arm end portions 38 are positioned between circumferentially adjacent pairs of plating segments (as shown, for example, in FIG. 4B) in which case neither lead pair 24a,24c and 24b,24d is electrically coupled.

Figures 5, 6, 7:
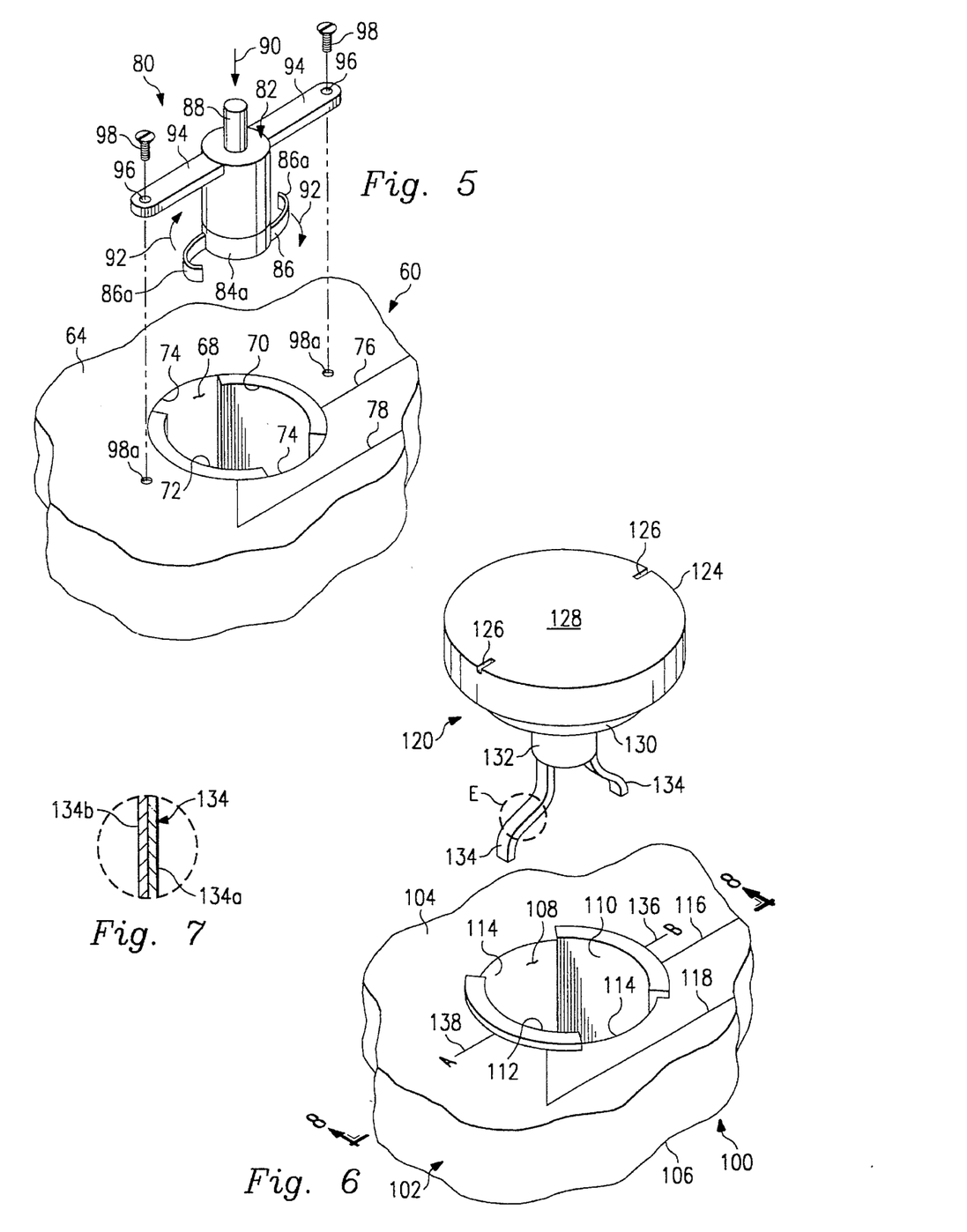
FIG. 5 is a simplified exploded top side perspective view of a circuit board portion having an alternate embodiment of the switching structure incorporated therein.
FIG. 6 is a simplified exploded top side perspective view of a circuit board portion having incorporated therein a shunt structure embodying principles of the present invention.
FIG. 7 is an enlarged scale cross-sectional detail view of the circled area "E" in FIG. 6 and illustrates a portion of one of the bimetallic contact leg portions of the shunt structure.

A first alternate embodiment 60 of the circuit board structure 10 is illustrated in FIG. 5 and includes a portion of a dielectric substrate member 62 having top and bottom sides 64 and 66, and a circularly cross-sectioned through hole 68 extending between the top and bottom substrate member sides 64 and 66. A diametrically opposed pair of electrically conductive metal plating segments 70,72 are disposed on the interior side surface of the through hole 68 and are circumferentially separated by a diametrically opposed pair of nonconductive interior side surface portions 74 of the through hole 68. The metal plating segments 70,72 are respectively coupled to the inner ends of a pair of electrically conductive surface traces 76,78 extending along the top side 64 of the substrate portion 62.

The segmentally plated through hole 68 forms a portion of a compact switching system 80 incorporated in the circuit board structure 60 and further including a generally conventionally conventional "push-to-activate" switch 82. Switch 82 has a cylindrical body portion 84 with a lower end section 84a which is rotatable relative to the balance of body portion 84. An elongated metal switch contact arm member 86, with curved outer ends 86a, has a central portion thereof anchored to the body end section 84a for rotation therewith.

At the top end of the cylindrical body portion 84 is an upwardly projecting push button 88 which is spring-biased toward its illustrated upwardly projecting position, but may be manually depressed, as indicated by the arrow 90, relative to the top end of the body portion 84. Via a conventional ratchet mechanism (not) shown) within the body portion 84, each depression of the push button 88 rotates the lower body end section 84a, and thus the contact arm member 86, a quarter turn in a clockwise direction as indicated by the arrows in FIG. 5.

The push-to-activate switch 82 has a diametrically opposite pair of mounting arms 94 projecting radially outwardly from a top end portion of its body 84 and having mounting holes 96 formed in their outer ends. Switch 82 is installed in the segmentally plated through hole 68 by inserting the switch body 84 and the contact arm member 86 downwardly into the through hole 68 and securing the switch in place by extending mounting screws 98 downwardly through the mounting arm holes 96 and threading the screws 98 into underlying mounting holes 98a in the top side 64 of the substrate portion 62. The locations of the mounting holes 98a serve to rotationally orient the switch 82 and the plating segments 70,72 in a manner such that the push button 88 may be successively pushed to alternately bring the contact arm member outer ends 86a into and out of engagement with the plating segments 70,72 to thereby selectively couple and uncouple the leads 76,78 simply by pushing the switch button 88.

A second alternate embodiment 100 of the previously described circuit board structure 10 is illustrated in FIG. 6 and includes a portion of a dielectric substrate member 102 having top and bottom sides 104 and 106, and a circularly cross-sectioned through hole 108 extending between the top and bottom substrate member sides 104 and 106. A diametrically opposed pair of electrically conductive metal plating segments 110,112 are disposed on the interior side surface of the through hole 108 and are circumferentially separated by a diametrically opposed pair of nonconductive interior side surface portions 114 of the through hole 108. The metal plating segments 110,112 are respectively coupled to the inner ends of a pair of electrically conductive surface traces 116,118 extending along the top side 104 of the substrate portion 102.

The segmentally plated through hole 108 forms a portion of a compact switching system 120 incorporated in the circuit board structure 100 and further including a switch structure in the form of a shunt 122 that is releasably insertable into the through hole 108 to selectively couple and uncouple the plating segments 110 and 112, and thus selectively couple and uncouple the leads 116 and 118.

Shunt 122 includes a body portion having a relatively thin cylindrical plastic top end portion 124 with a diameter somewhat larger than that of the through hole 108 and having a diametrically opposed pair of radially extending alignment lines 126 suitably formed on its top side 128, a reduced diameter intermediate plastic cylindrical body portion 130 depending from the underside of the top end portion 124 and being slidably insertable into the through hole 108, and a still further reduced diameter cylindrical metal bottom end portion 132 with a diametrically opposite pair of outwardly bent resilient metal contact strips 134 depending therefrom.

As best illustrated in FIG. 6, each of the contact strips 134 is of a bimetallic, thermally deflectable construction and is formed from two layers 134a,134b of different metal materials. The dissimilar metals are chosen to cause the contact strips 134 to thermally deflect toward one another when heated to a predetermined temperature.

Figures 8A, 8B:
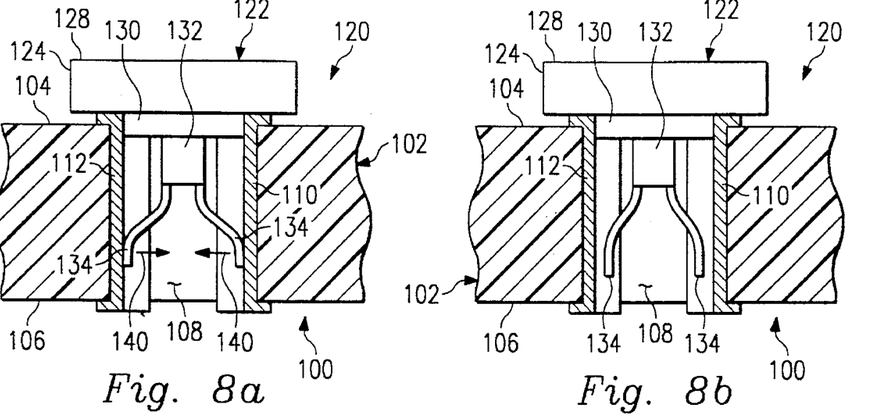
FIGS. 8A and 8B are simplified cross-sectional views taken along line 8—8 of FIG. 6 and illustrating the operation of the shunt structure when installed in its associated circuit board portion.

Referring now to FIG. 8A, to releasable couple the plating segments 110 and 112, and thus the leads 116 and 118, a lower end portion of the shunt 122 is simply inserted into the through hole 108 until the intermediate body portion 130 is slidably received in the through hole 108, the top body end portion 124 bottoms out against the top side of the substrate member 102, and the bimetallic contact strips 134 resiliently engage inner side surface portions of the plating segments 110 and 112 as indicated.

Appropriate circumferential alignment of the contact strips 134 and the plating segments 110,112 is facilitated by a pair of diametrically opposite, radially outwardly extending alignment lines 136,138 (see FIG. 6) formed on the top side 104 of the substrate portion 102. Lines 136,138 are respectively and circumferentially aligned with the plating segments 110 and 112, and have the indicia "B" and "A" appropriately imprinted on the top substrate side adjacent their outer ends. By circumferentially aligning the shunt lines 126 with the substrate lines 136,138 during insertion of the shunt 122 into the through hole 108 a visual indication is given that the contact strips 134 are circumferentially aligned with and in engagement with the plating segments 110 and 112.

Due to the bimetallic construction of the contact strips 134, the inserted shunt 122 not only serves to electrically couple the leads 116 and 118, but serves as a fuse as well to selectively limit the maximum electrical current that can pass through the coupled leads 116 and 118. As indicated in FIG. 8B, in response to an current flow through the coupled leads 116 and 118 above a maximum predetermined current, the contact strips 134 are heated to a point causing them to thermally deflect toward one another, as indicated by the arrows in FIG. 8A, and out of engagement with the plating segments 110,112 to thereby automatically decouple the leads 116,118. Alternatively, the contact strips 134 could be formed of a unitary metal construction in which case the decoupling of the leads 116,118 could be effected simply by pulling the shunt out of the substrate through hole.

Figure 9:
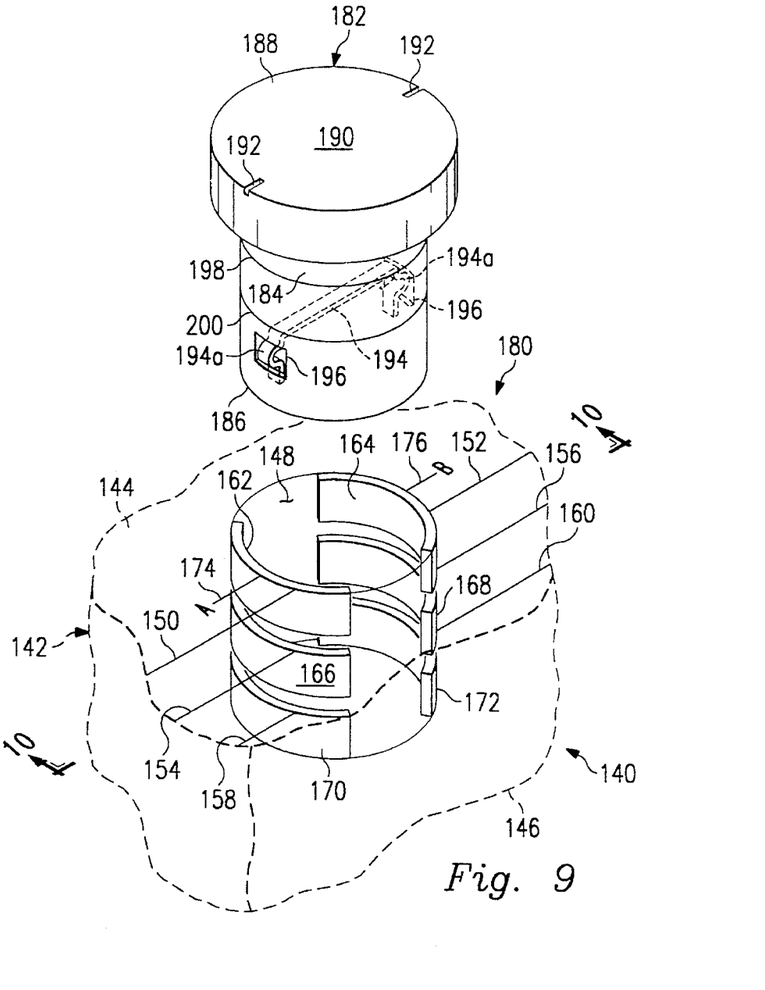
FIG. 9 is a partially phantomed, simplified exploded top side perspective view of a circuit board portion and an adjustable shunt structure used in conjunction therewith.

A third alternate embodiment 140 of the previously described circuit board structure 10 is illustrated in FIG. 9 and includes a portion of a dielectric substrate member 142 having top and bottom sides 144 and 146, and a circularly cross-sectioned through hole 148 extending between the top and bottom substrate member sides 144 and 146. Unlike the previously described substrate members, the substrate member 142 is of a multi-tier construction, having a pair of electrically conductive leads 150,152 extending along its top side 144, a pair of electrically conductive leads 154,156 extending through its interior, and a pair of electrically conductive leads 158,160 extending along its bottom side 146.

Like the previously described substrate through holes, the through hole 148 is segmentally plated with an electrically conductive metal material. However, the original metal plating material applied to the interior side surface of the through hole 148 is both circumferentially and axially segmented in a manner leaving a diametrically opposed pair of circumferentially separated plating segments 162 and 164 adjacent the top side 144 of the substrate portion 142; a diametrically opposed pair of circumferentially separated plating segments 166 and 168 disposed in the interior of the substrate portion 142, downwardly separated from the plating segments 162,164 and circumferentially aligned therewith; and a diametrically opposed pair of circumferentially separated plating segments 170 and 172 adjacent the bottom side 146 of the substrate portion 142, downwardly separated from the plating segments 166,168 and circumferentially aligned therewith.

Inner ends of the leads 150,152 are respectively connected to the upper plating segments 162,164; inner ends of the leads 154,156 are respectively connected to the vertically intermediate plating segments 166,168; and inner ends of the leads 158,160 are respectively connected to the lower plating segments 170,172. For subsequently described alignment purposes, a diametrically opposite pair of lines 174, 176 extend along the top side 144 of the substrate portion 142 radially outwardly from circumferentially central portions of the plating segments 162,164 and have the reference letters "A" and "B" respectively imprinted adjacent their radially outer ends.

The segmentally plated through hole 148 forms a portion of a compact switching system 180 incorporated in the circuit board structure 140 and further including a switch structure in the form of a shunt 182 that is releasably insertable into the through hole 148 to electrically couple and uncouple a selected plating segment pair 162 and 164, 166 and 168 or 170 and 172, to thereby electrically couple and uncouple a selected lead pair 150 and 152, 154 and 156 or 158 and 160.

Shunt 182 includes a cylindrical plastic body 184 having a bottom end 186, a diameter sized to permit the body 184 to be slidably inserted into the segmentally plated through hole 148, and a radially enlarged cylindrical top end section 188 having a diameter somewhat larger than that of the through hole 148, and a top side 190 upon which a diametrically opposite pair of radially extending alignment lines 192 are suitable formed. Upwardly adjacent the bottom end 186 of the body portion 184 a metal contact strip 194 diametrically extends through the body portion 184 and has bent outer end portions 194a that are circumferentially aligned with the diametrically opposite lines 192 on the top side 190 of the top end section 188 of the shunt body portion 188.

The contact strip end portions 184a extend through side surface pocket areas 196 on the shunt body 184 and normally project outwardly beyond the outer side surface of the cylindrical shunt body 184. However, the contact strip portions 184a may be resiliently deflected into their associated side surface pocket areas 196. For purposes later described, an axially spaced pair of upper and lower circular alignment lines 198,200 are formed on the outer side surface of the shunt body portion 184 between the side surface pockets 196 and the radially enlarged top end section 188 of the shunt body.

Figure 10A:
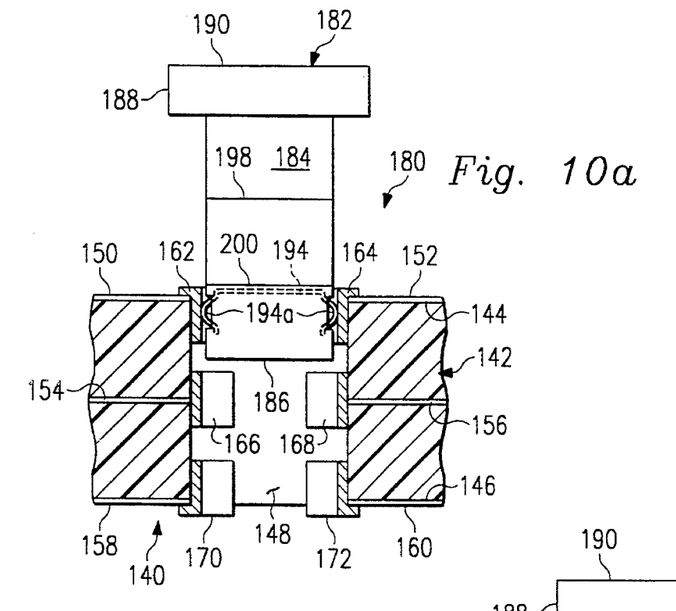
FIGS. 10A–10C are simplified cross-sectional views taken along line 10—10 of FIG. 9 and illustrating the operation of the adjustable shunt structure when installed in its associated circuit board portion.

To electrically couple the upper lead pair 150 and 152 the shunt body 184 is downwardly inserted into the through hole 148, with the shunt top end lines 192 (see FIG. 9) circumferentially aligned with the substrate lines 174 and 176, until the circular shunt body line 200 is vertically aligned with the top side 144 of the substrate portion 142 as indicated in FIG. 10A. This causes the contact strip end portions 194a to be resiliently deflected into the shunt body side surface pockets 196 while holding the contact strip end portions 194 in resilient contact with the upper plating segment pair 162 and 164.

Figure 10B:
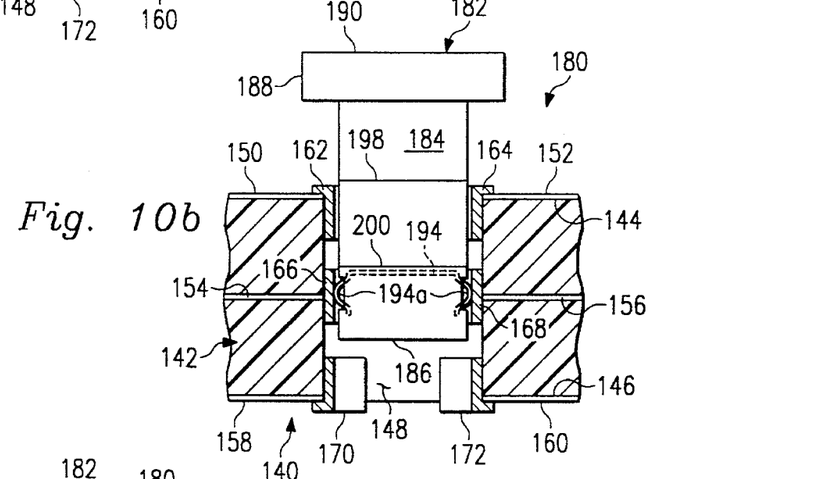
Figure 10C:
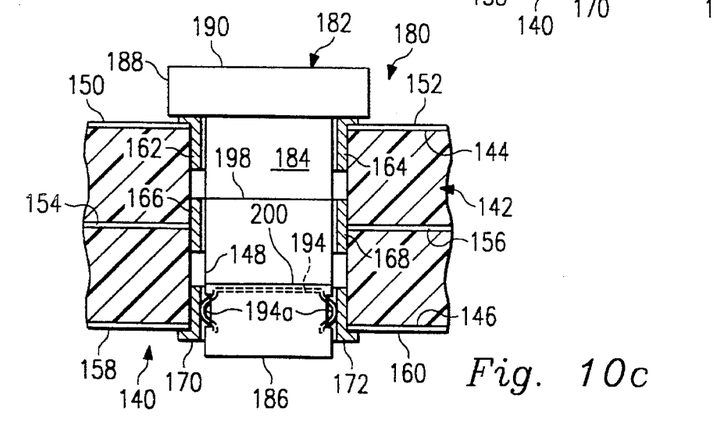

To subsequently couple the intermediate lead pair 154 and 156 the shunt body 184 is pushed further into the through hole 148 until the shunt 182 reaches its FIG. 10B position in which the shunt body line 198 is generally aligned with the top side 144 of the substrate portion 142. In this position of the shunt 182, the contact strip end portions 194a resiliently engage the intermediate plating segment pair 166 and 168. Finally, to couple the bottom lead pair 158 and 160 the shunt body 84 is pushed further into the through hole 148 until the top shunt end section 188 bottoms out against the top side 144 of the substrate portion 142, thereby bringing the shunt 182 to its FIG. 10C position. In this position of the shunt 182, the contact strip end portions 194a resiliently engage the bottom plating segment pair 170 and 172.

As can be seen from the foregoing, the present invention advantageously provides various representative circuit board structure embodiments with switching systems which, due to their use of segmentally plated through hole portions of the circuit boards as part of the switching systems, substantially reduce the overall board area required to provide for the selective coupling and uncoupling of selected pluralities of their electrically conductive lead portions. The representatively illustrated switch structure portions of the overall switching systems have compact configurations, are easy to use, and are relatively inexpensive to manufacture.

The previously described segmentally plated through hole portions of the representatively illustrated circuit board switching systems of the present invention have been shown as having equally spaced plating segments, and the switch structures have been representatively shown as being capable of selectively connecting and disconnecting two plated segments. It will be readily appreciated by those of skill in this particular art, however, that the plating segments could be unequally spaced, and a particular switch structure could also be used to selectively connect and disconnect more than two plating segments if desired. Additionally, switch structures of a variety of other constructions and configurations could be used in conjunction with a segmentally plated through hole if desired.

The foregoing detailed description is to be clearly understood as being given by way of illustration and example only, the spirit and scope of the present invention being limited solely by the appended claims.

What is claimed is:

1. Circuit board with an integral switch comprising:

a dielectric substrate member;

a hole formed said substrate member, said hole having an interior surface;

spaced apart first and second electrically conductive segments plated to said interior surface of said hole;

first and second electrically conductive leads respectively coupled to a different one of said first and second electrically conductive segments; and switch means, for placement in said hole, for selectively coupling said first and second electrically conductive segments, said switch means including a switch portion insertable into said hole and movable therein between a first position for electrically coupling said first and second plating segments, and a second position for electrically decoupling said first and second plating segments, said switch portion comprising an electrically conductive element including a pair of resilient metal contacts electrically coupled to one another.

2. The circuit board of claim 1 wherein:

said first and second electrically conductive segments are circumferentially spaced around the interior of said hole; and said switch portion is rotatable within said hole between a first position in which said electrically conductive element engages and electrically couples said first and second segments, and a second position in which said electrically conductive element is disengaged from and decouples said first and second segments.

3. The circuit board of claim 2 wherein:

said electrically conductive element is fixedly connected to said switch means, and the entire switch means, after insertion of said portion thereof into said hole, is rotatable relative to said substrate member.

4. The circuit board of claim 2 wherein:

said switch portion is rotatable relative to the balance of said switch means; and said switch means includes a manually depressible switch button, and means responsive to the depression of said switch button for rotating said switch portion a predetermined arc relative to the balance of said switch means.

5. The circuit board of claim 2 further comprising:

cooperating alignment means formed on said substrate member and said switch means for providing visual indicia with respect to which of said first and second positions said switch means is in.

6. The circuit board of claim 1 wherein:

said first and second electrically conductive segments are circumferentially spaced around the interior of said hole.

7. The circuit board of claim 1 wherein:

said resilient metal contacts are of bimetallic construction and, when resiliently engaged with said first and second segments, are thermally deflectable out of engagement with said first and second segments in response to being heated by a predetermined electrical current flow therethrough.

8. The circuit board of claim 1 further comprising:

cooperating alignment means formed on said substrate member and said switch means for providing visual indicia with respect to which of said first and second positions said electrically conductive portion of said switch means is in.

9. The circuit board of claim 1 wherein:

said first and second electrically conductive segments are circumferentially spaced around the interior of said hole, said circuit board further comprising circumferentially spaced apart third and fourth electrically conductive segments plated to said interior side surface of said hole and axially separated from said first and second segments.

10. The circuit board of claim 9 wherein:

said spaced pair of resilient metal contacts are resiliently engageable with said firs and second segments when said switch portion is in a first position, and resiliently engageable with said third and fourth segments when said switch portion is in a second position.

11. The circuit board of claim 9 wherein:

said first and second electrically conductive leads extend through the interior of said dielectric substrate member.

12. The circuit board of claim 9 further comprising:

cooperating alignment means formed on said substrate member and said switch means for providing visual indicia with respect to which of said first or second positions said switch portion in.

13. Method for manufacturing a circuit board having an integral switch, comprising the steps of:

forming a dielectric substrate member;

forming a hole extending in said substrate member, said hole having an interior side surface;

plating spaced apart first and second electrically conductive segments within said interior side surface of said hole;

coupling spaced apart first and second electrically conductive leads to a respective one of said first and second electrically conductive plating segments;

placing electronic components on said substrate member; and providing means, within said hole, for selectively and conductively coupling said first and second electrically conductive segments.

14. The method of claim 13 further comprising:

said first and second conductive segments are circumferentially spaced around the interior of said hole.

15. The method in claim 13 further comprising:

said coupling means includes a switch having an electrically conductive portion is fixedly connected to the balance of said switch, and the entire switch, after insertion of said electrically conductive portion thereof into said hole, is rotatable relative to said substrate member.

16. Method for use in conjunction with a circuit board having a dielectric substrate member with first and second opposite sides and carrying a mutually spaced apart plurality of electrically conductive leads, the method providing the circuit board with compact switching means for selectively and electrically coupling and decoupling at least one predetermined set of leads in said mutually spaced apart plurality thereof, said method comprising the steps of:

forming a hole in said substrate member, said hole having an interior surface;

coating said interior surface of said hole with an electrically conductive plating material;

removing portions of said plating material to leave on said interior surface of said hole a mutually spaced apart plurality of plating segments, each of said plating segments being electrically coupled to an end of a different one of said mutually spaced apart plurality of electrically conductive leads; and providing a switch structure having an electrically conductive portion removably insertable into said hole and being movable therein into and out of engagement with a predetermined set of plating segments in said mutually spaced apart plurality thereof, to electrically couple and decouple said predetermined set of plating segments.

17. The method of claim 16 further comprising the step of:

configuring said electrically conductive portion of said switch structure to be rotationally movable within said hole.

18. The method of claim 16 further comprising the step of:

configuring said electrically conductive portion of said switch structure to be axially movable within said hole.

19. The method of claim 16 further comprising the step of:

forming said hole so as to be extendible between said first and second sides of said substrate member.

20. The method of claim 19 further comprising the step of:

configuring said electrically conductive portion of said switch structure to be rotationally movable within said hole.

21. The method of claim 19 further comprising the step of:

configuring said electrically conductive portion of said switch structure to be axially movable within said hole.

* * * * *